METHOD OF PRODUCING A GERMANIUM TRANSISTOR

Filed July 3, 1968

United States Patent Office 3,583,857
Patented June 8, 1971

3,583,857
METHOD OF PRODUCING A GERMANIUM TRANSISTOR

Winfried Meer, Hohenbrunn, and Wolfgang Schembs, Munich, Germany, assignors to Siemens Aktiengesellschaft Filed July 3, 1968, Ser. No. 742,263
Claims priority, application Germany, July 6, 1967, S 110,700
Int. Cl. H01l 7/44, 7/46
U.S. Cl. 29—588 17 Claims

ABSTRACT OF THE DISCLOSURE

A method of producing a germanium transistor, by providing the masked surface of a doped germanium crystal with a window extending to the semiconductor material. An activator is indiffused through this window into the fundamental material of the semiconductor crystal, producing the opposite conductance type which forms a base region with p-n junction. An emitter region is produced within said base region. The emitter region does not contact the collector region at any place. This method is characterized in that the activator which produces the base region is diffused into a planar surface portion of the germanium crystal which is inclined at least 0.5° and at most 4° to a family of 111-surfaces. In the same region, the emitter is produced by an alloying-in process. The deepest point of the base-collector junction is at a depth of 1–3$\mu$, while the base junction is to a maximum depth of 0.8$\mu$.

Figure 1:
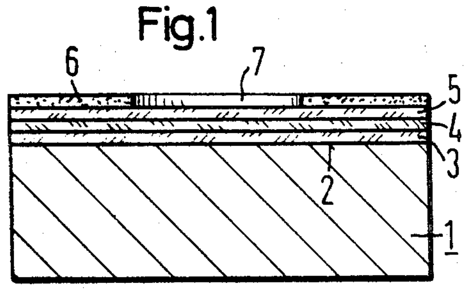
Figure 2:
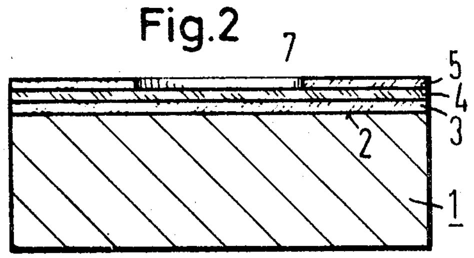

The so-called planar transistor is one of the most important transistor types for high-frequency use. It is characterized by its mode of manufacture. This type of production consists in producing, preferably by thermal oxidation, a surface layer of silicon oxide in a wafer-like silicon crystal of p- or n-type. Subsequently a window is etched into one of the surfaces of the wafer, extending down to the actual semiconductor surface. This window is used for indiffusion of the doping material, which determines the base zone and produces the opposite conductance type to the fundamental material of the silicon crystal. The doping material used must be retarded by the oxide layer so that the base region, which is obtained through the diffusion process, is essentially limited to the semiconductor region, directly at the diffusion window, whereas the p-n junctions located at the semiconductor surface are protected by the oxide layer. The process may be repeated by growing a new oxide layer at the locality of the diffusion window, by etching a smaller diffusion window into said oxide layer and by causing the doping material which produces the emitter zone to penetrate from a gaseous phase. The p-n junction thus produced between emitter zone and base region or zone, of course, may not touch any part of the previously produced p-n junction, between the base region and the fundamental material of the semiconductor material which is to be used as a collector. The individual regions are then each provided with one electrode, in a known manner. The advantages of such a transistor, particularly from the electrical point of view, are known.

But more than anything else, these advantages create a desire to produce also planar transistors from semiconductor materials other than silicon. The thermal oxidation used to produce a protective masking layer when silicon is employed, cannot be used in a number of other semiconductor materials, especially germanium, since the resulting oxide has hardly any masking properties and furthermore has a low stability, from a mechanical and chemical viewpoint. Therefore, when applying the planar technology to the production of germanium transistors, the protective layer material must be produced through the thermal reaction of a suitable reaction gas, or by spraying or by vapor deposition. It should be noted that $Si_3N_4$ can be used as a protective layer material in addition to $SiO_2$.

It is an object of the invention to produce germanium planar transistors whose electrical properties are very favorable especially with respect to high-frequency characteristics, reproducibility and stability.

The present invention relates to a method of producing a germanium transistor, by providing the masked surface of a doped germanium crystal with a window extending to the semiconductor material. An activator is indiffused through this window into the fundamental material of the semiconductor crystal, producing the opposite conductance type which forms a base region with p-n junction. An emitter region is produced within said base region. The emitter region does not contact the collector region at any place. This method is characterized in that the activator which produces the base region is diffused into a planar surface portion of the germanium crystal which is inclined at least 0.5° and at most 4° to a family of 111-surfaces. In the same region, the emitter is produced by an alloying-in process. The deepest point of the base-collector junction is at a depth of 1–3$\mu$, while the base junction is to a maximum depth of 0.8$\mu$.

Other preferred embodiment possibilities of the method according to the invention are as follows:

(1) The masking layer is preferably a combination of at least one $SiO_2$ layer and an $Si_3N_4$ layer. The masking layer is favorably compounded with doping material and remains, according to a preferred embodiment of a germanium transistor produced according to the invention, at the semiconductor surface, as a protection of the p-n junctions. It may sometimes be advantageous to peel off the mask used during the diffusion process, after the termination of said diffusion process, and to replace the mask with a new oxide or nitride layer.

(2) The protective layer may be used as a carrier of auxiliary electrodes (field electrodes) and for conducting paths serving as contacts.

(3) A further development of the present method relates in particular to the production of terminal electrodes, using a layer of one of chromium and silver, chromium and aluminum or pure aluminum.

The invention will now be described with reference to a preferred embodiment example as shown in the drawings in which FIGS. 1 to 7 show a sequence of steps for carrying out the invention.

The fundamental material used may be an n- or p-conducting monocrystalline germanium disc or wafer 1. In FIG. 1, we start with a p-conducting germanium disc of a specific resistance of 3 ohm·cm. and doped, for example, with a gallium or indium. The germanium disc is subjected to the customary polishing and etching. The axis of the germanium wafer 1 preferably coincides with a 111-direction. The planar surface, indicated as 2, inclines diagonally toward the 111-axis, so as to be inclined by at least 0.5° and at most 4° toward a family of 111-surfaces. It is preferred that the error orientation of surface portion 2 of the germanium crystal 1 is 1 to 2° to the family of 111-surfaces.

A masking layer is now applied upon the planar error oriented surface 2 of the germanium crystal 1. This masking layer is provided with a window 7, extending to the semiconductor surface, so that the doping material which is used to produce the base region can be locally diffused from the gaseous phase into the semiconductor crystal. It is recommended to use a combination of several partial layers, combined partly of $Si_3N_4$ and partly of $SiO_2$. As shown in the figures generally, wherein the same feature is given the same number, first of all an $SiO_2$ layer 3 is precipitated from a gaseous phase upon the planar, error oriented surface 2 of the germanium crystal 1, then an $Si_3N_4$ layer 4 and on top thereof another $SiO_2$ layer 5. The present method uses known reaction gases in which the germanium crystal 1 is heated to a temperature sufficiently high for a thermal reaction of the reaction gas, but not high enough to melt the germanium surface. For example, $SiO_2$ layers may be produced through thermal dissociation of a volatile silicic acid ester, diluted with an inert gas, or of a siloxane, e.g. disiloxane, while $Si_3N_4$ layers may be obtained through a thermal dissociation of diluted reaction gas comprised of volatile silanes and ammonia.

At least one partial layer is provided with a doping material, for example phosphorus, if the protective layer is to remain on the semiconductor surface upon the completion of the semiconductor component.

In the embodiment shown in the drawings, the lowest layer 3 of masking material, seated directly on the semiconductor surface 2, is comprised of $SiO_2$ and has a thickness of less than 2000 A. while the above-lying layer 4 is comprised of silicon nitride. The reason for this combination resides first in the fact that $Si_3N_4$ is superior in regard to its masking ability. Furthermore, an $Si_3N_4$ layer, growing directly upon a germanium surface, results in too high term densities, which makes the production of a p-n junction questionable. In the example, a second $SiO_2$ layer 5 is furthermore applied on the $Si_3N_4$. The thickness of layer 4 is at the most 1000 A., the thickness of the oxide layer 5 is, for example, several hundred A. These layers serve, as described, as an etching mask.

FIG. 1 illustrates the semiconductor crystal 1 with the error oriented planar surface 2, the lowest oxide layer 3, the nitride layer 4 and the second oxide layer 5. A photo varnish mask 6 is also applied for the production of diffusion window 7.

The $SiO_2$ surface of layer 5 is now subjected, at the location of window 7, to an etching solution which is masked by the photo varnish 6. Experience has shown that suitable solutions for etching $SiO_2$, such as hydrofluoric acid or hydrofluoric acid buffered with ammonium nitrate, do not attack the $Si_3N_4$ layer 4, or only to a very slight extent, and therefore it is customary to etch away only the uppermost oxide layer 5, at the locality of window 7, while the lower lying layers 3 and 4 are only slightly influenced, if at all. After the photo varnish mask 6 is loosened off, the remaining parts (FIG. 2) of the upper oxide layer 5 serve as an etching mask for producing window 7, in the lower lying $Si_3N_4$ layer 4. To this end, an etching solution is used which dissolves the $Si_3N_4$ of layer 4, but virtually does not attack the $SiO_2$. Hot phosphoric acid, which has a boiling point of 180° C., may be used for example.

Figure 3:
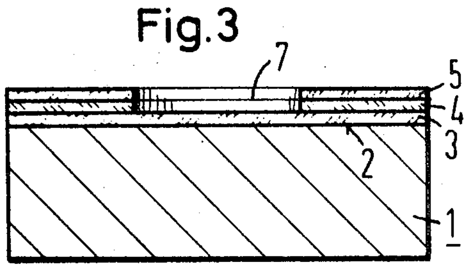
Figure 4:
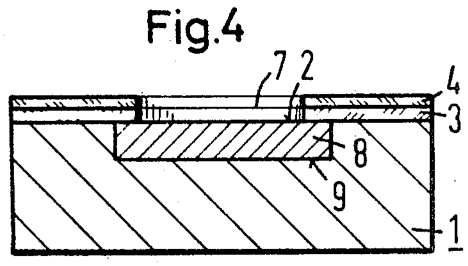

The condition obtained through the etching of layer 4, masked with the remnants of the $SiO_2$ layer 5, is illustrated in FIG. 3. The window 7 extends through the oxide layer 5, through the $Si_3N_4$ layer 4, and ends at the lower $SiO_2$ layer 3. If an etching solution which dissolves only $SiO_2$, but not $Si_3N_4$, is again used, the oxide layer 3 is also etched through, to the semiconductor surface 2, and the desired diffusion window is now finished. The remnants of the upper $SiO_2$ layer 5 are usually removed, too, during the last etching process, and the condition illustrated in FIG. 4 is now obtained. The diffusion of the activator for producing the base region remains to be effected.

As investigations conducted during the testing of the present invention have shown, $Si_3N_4$ protective layers stabilize the lower lying semiconductor surface better than an $SiO_2$ protective layer. On the other hand, the mechanical stress produced by an $Si_3N_4$ layer causes such a distortion of the germanium lattice, immediately adjacent beneath an $SiO_2$ layer, that the production of perfectly functioning p-n junctions, through diffusion into such a distorted crystal lattice, becomes questionable. For this reason, the oxide layer 3, as well as the $Si_3N_4$ layer, are made as thin as possible. This is the case shown in the above example.

A silicon nitride layer, precipitated below 800° C., has poor stabilizing as well as poor masking qualities. Thus, in accordance with the present invention, the $Si_3N_4$ layer is preferably precipitated above 800° C., with care taken not to reach the melting point of germanium. The $Si_3N_4$ precipitated under such temperature conditions is not dissolved by hydrofluoric acid and other etching solutions which attack $SiO_2$. For this reason, in the preferred embodiment shown in the figures, the $Si_3N_4$ layer and the lower lying $SiO_2$ layer cannot be etched through during the production of the diffusion window 7, if the $SiO_2$ layer 5 is used as an etching mask. One is forced, however, to take such action, since no photo varnish or the like is so far available to act as an etching mask that would permit the etching of an $Si_3'N_4$ layer, precipitated above 800° C., without also peeling off or becoming loose from the substrate.

Now, an activator, determining the conductance type of the base region, e.g. antimony, arsenic or phosphorus, is indiffused from a gaseous phase, and in a known manner, into the germanium surface 2 covered with the diffusion mask, in accordance with FIG. 4. This results in base region 8 with a p-n junction 9 to the fundamental material of the semiconductor crystal 1. In the example, the surface concentration is $5 \cdot 10^{18}$ donor atoms/cm.$^3$ and the diffusion depth is approximately 1.5$\mu$.

In accordance with the invention, the base region should not penetrate into the semiconductor crystal deeper than 3$\mu$, as the electrical properties of the transistors would otherwise be considerably impaired. Care must be taken not to exceed this diffusion depth for p-n junction 9. The germanium disc 1 in the example has a thickness of 0.15 mm.

It is also advantageous to produce simultaneously a plurality of such transistors from a large semiconductor wafer. To this end, a plurality of equidistant windows 7 are etched in a known manner into the masking layer which coats a big wafer, by using suitable photo masks, whereupon a plurality of base regions 8 and a plurality of emitter regions are produced in a common process.

Figure 5:
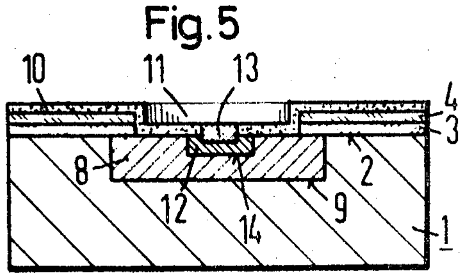

After the base region, the emitter is produced through an alloying process, whereby an alloying depth of a maximum of 0.8$\mu$ is permitted. The doping material which forms the emitter is preferably locally vapor deposited upon the semiconductor surface and is then alloyed-in. To achieve a defined, localized vapor deposition, a vapor deposition mask, e.g. of photo varnish, is used which leaves free the location for producing the emitter or, during a simultaneous production, also exposes the locations for the production of emitter regions. The photo varnish mask is shown in FIG. 5 and is given reference numeral 10. It exposes the window 11 to the semiconductor surface 2. The vapor deposited emitter layer 13 is then alloyed-in, possibly following the removal of the photo varnish mask, which leads to the production of an emitter region 12 with a p-n junction 14 to the base region 8.

It is recommended to vapor deposit the material which produces the emitter, not only at the location of the emitter to be produced, but also upon an additional, exposed region of the collector zone, located away from the p-n junction, after the removal of the masked layer from this locality, and to alloy said material into the collector region. This produces in the p-conducting region of the collector zone (the original material of the semiconductor base crystal) *a*, for example, annular, highly doped p+ region 16. This p+ region is then contacted with an electrode which may extend, in form of a metallization of the protective layer 3, 4, up to the vicinity of the p-n junction 9, and possibly even up to the immediate vicinity of p-n junction 14. Such an auxiliary region at the collector increases the stabilizing effect and reduces the collector-path resistance. The alloying-in of the material which produces region 16 is preferably effected simultaneously with the alloying-in of the emitter.

Figure 6:
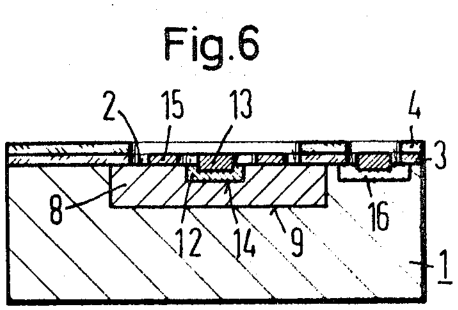

Simultaneously or sequentially to the production of the emitter, an electrode which contacts the base region is produced. This is done by alloying-in a suitable metal which contacts, in barrier-free relation, the material of region 8. The metal is alloyed-in away from the emitter end, e.g., in the shape of a ring 15, which concentrically surrounds the emitter. FIG. 6 shows the arrangements, not yet contacted by a field electrode and produced in accordance with the aforedescribed processes.

Following this state, it is recommended that the protective layer, formed through the masking layer 3 and 4, is either loosened off and renewed or, and this seems more appropriate in view of the aforedescribed steps, that it is augmented. In the later instance, the arrangement shown in FIG. 5 is completely coated with an insulating layer produced below 500° C. and preferably comprised of $SiO_2$. This protective layer 14, however, must again be locally removed at places intended for the not yet carried out contacting. In this respect also, the known photo varnish technique affords an execellent method. In this manner, either the electrodes which are already present in form of a metallization of the semiconductor surface, or a place of the semiconductor surface not yet provided with an electric terminal, are exposed (such as the location of the collector electrode to be produced) and are provided with electrical terminals as follows:

(a) The germanium wafer produced in accordance with the above-described manner and coated with an insulating protective layer, with the exception of the places intended for contacting, is completely covered, under a vacuum, with a contact metal, preferably aluminum or chromium alloyed with aluminum or silver. This metallization is then loosened at the places not intended for contacting, preferbly by using a photo varnish etching mask, whereby the selected etching solution must not attack the material of the protective layer or of the seminconductor.

(b) An alternative method is to vapor deposit the contacting metal locally only. Vapor masks, particularly of photo varnish, are used for this purpose.

(c) Finally, the contacting may be not by vapor deposition, but, possibly even omitting the second masking layer, by thermo compression or directly in another manner, as with suitable terminal wires.

Figure 7:
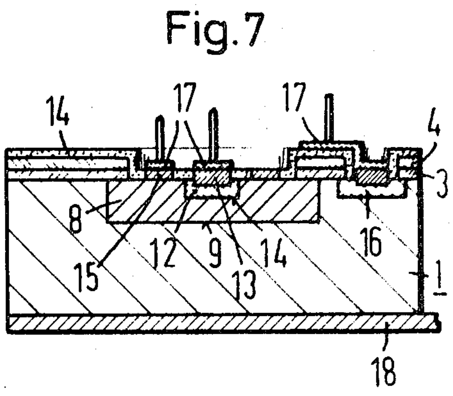

The structure which is finally obtained is shown in FIG. 7 in which the electrical contacts are shown at 17.

The thus produced arrangement is mounted in a metal housing, whereby the carrier 18 to be used, e.g. a metal plate, is simultaneously used as a collector electrode and is connected with the collector region 1 of the transistor by means of alloying. Another suitable mounting method is to embed the transistor with its electrodes into a synthetic casing, such as epoxide resin. In this case the transistor is preferably previously coated with a silicon varnish.

We claim:

1. The method of producing a germanium transistor, which comprises coating the surface of a doped germanium crystal with a masking layer, providing a window extending to the semiconductor material through which an activator causing an opposite conductance type, which produces the base region with p-n junction, is diffused into the fundamental material of the semiconductor serving as the collector region, producing in the area of said base region an emitter region which does not contact said collector region at any place, diffusing said activator which produces the base region into a planar surface portion of the germanium crystal which is inclinded to a family of (111)-surfaces by at least 0.5° and at most 4°, and producing the emitter in the same area by alloying, with the greatest depth of the base-collector junction at 1 to 3$\mu$ and that of the emitter-base junction at 0.8$\mu$.

2. The method of claim 1 wherein the planar surface portion of the germanium crystal is inclined to the (111)-surfaces by from 1° to 2°.

3. The method of claim 1, wherein the masking layer is produced partly through the use of a reaction gas, suitable to precipitate $SiO_2$, for example silicic acid ester or disiloxane, and partly through the use of a reaction gas which is suitable to precipitate an $Si_3N_4$ layer, for example a mixture of ammonia and silane.

4. The method of claim 1, wherein an $SiO_2$ layer is first precipitated, then an $Si_3N_4$ layer and finally another $SiO_2$ layer; subsequently thereto using a photo varnish mask, the upper $SiO_2$ layer is etched away locally at the location of the diffusion window to be produced, up to the below-lying $Si_3N_4$; then, by using the remnants of the upper $SiO_2$ layer as an etching mask, the window is etched through to the below-lying $Si_3N_4$ layer; and finally, by using the remaining portion of the $Si_3N_4$ layer as an etching mask, the window is etched through the lower $SiO_2$ layer to the semiconductor surface.

5. The method according to claim 4, wherein doping substances are precipitated from the gaseous phase together with the material of the protective layer and installed into the protective layer.

6. The method of claim 5, wherein phosphorus atoms are installed into the protective layer, which is preferably comprised of oxide.

7. The method of claim 5, wherein the lower oxide layer is given a thickness of at most 2000 A., the $Si_3N_4$ at most 1000 A. and the upper oxide layer several hundred A., for example 500 A.

8. The method of claim 7, wherein the oxide layer is treated with an etching solution which does not attack the nitride layer or attacks it very insignificantly, such as a hydrofluoric solution buffered with ammonium nitrate, while the nitride layers are treated with an etching solution, not at all, or only slightly, impairing the oxide layers, such as phosphoric acid.

9. The method of claim 8, wherein following the production of the emitter region and preferably also the emitter electrode, and the base region, the masking layer is completely extended over the semiconductor surface.

10. The method of claim 8, wherein following the completion of the base diffusion, the protective layer used as a masking in said diffusion process is peeled off and substituted with a new protective layer, preferably of $SiO_2$ containing a dopant.

11. The method of claim 10, wherein the masking layer is also locally removed at the same time as the emitter region in the area outside the base region, the material which produces the emitter is applied at the same time as the same material outside of the base region in the area of the collector region and finally alloyed-in or indiffused, whereupon this region is provided with an electrical contact applied at the surface of an insulating protective layer which coats the finished transistor, up to the immediate vicinity of the base-collector junction.

12. The method of claim 11, wherein the material serving for contacting the electrodes is applied through vapor deposition upon the semiconductor surface.

13. The method of claim 12, wherein the semiconductor surface with a masking layer is provided with a vapor deposited metallization for contacting the individual electrodes across its entire area, and following said metallization the semiconductor is coated with an etching mask at the places intended for contacting, the parts of the metallization not coated by said etching mask are etched from the substrate.

14. The method of claim 13, wherein Al, Cr-Al, Ag-Cr or a layer sequence of Cr and Al or Cr and Ag is used for the contact.

15. The method of claim 13, wherein the emitter and the base terminal are contacted directly by omitting the second masking layer.

16. The method of claim 15, wherein the transistor and its electrodes are embedded in a synthetic housing, particularly epoxide resin.

17. The method of claim 16, wherein the transistor is coated with varnish prior to being embedded into synthetic material.

References Cited

UNITED STATES PATENTS

| | | | |
|---|---|---|---|
| 3,341,377 | 9/1967 | Wacker | 148—179 |
| 3,510,368 | 5/1970 | Hahn | 148—179 |

RICHARD O. DEAN, Primary Examiner

U.S. Cl. X.R.

148—179, 180, 185, 187, 189, 33.3